United States Patent

Nobori et al.

[11] Patent Number: 5,917,156
[45] Date of Patent: Jun. 29, 1999

[54] CIRCUIT BOARD HAVING ELECTRODES AND PRE-DEPOSIT SOLDER RECEIVER

[75] Inventors: Kazuhiro Nobori, Hirakata; Kazuto Nishida, Katano; Norihito Tsukahara, Sōraku-gun, all of Japan

[73] Assignee: Matsushita Electric Industrial Co., Ltd., Osaka-fu, Japan

[21] Appl. No.: 08/521,047

[22] Filed: Aug. 29, 1995

[30] Foreign Application Priority Data

Aug. 30, 1994 [JP] Japan ................... 6-205428

[51] Int. Cl.[6] ............... H05K 3/34; H05K 3/24; H01R 9/09
[52] U.S. Cl. .............. 174/250; 174/261; 228/180.1; 228/254; 361/777; 361/779
[58] Field of Search ............... 361/767, 768, 361/774, 777, 760, 779, 783; 174/261, 262, 260, 250; 228/180.21, 180.22, 180.1, 179.1, 215, 254; 439/83

[56] References Cited

U.S. PATENT DOCUMENTS

| | | | |
|---|---|---|---|
| 4,339,784 | 7/1982 | Shearer | 361/403 |
| 4,835,345 | 5/1989 | Haarde | 174/68.5 |
| 4,891,472 | 1/1990 | Vaurman et al. | 174/68.5 |
| 5,067,042 | 11/1991 | Nagano | 361/406 |
| 5,227,589 | 7/1993 | Weeks | 174/263 |
| 5,243,143 | 9/1993 | Throop et al. | 174/263 |
| 5,453,582 | 9/1995 | Amano et al. | 174/261 |

FOREIGN PATENT DOCUMENTS

| | | |
|---|---|---|
| 64-61090 | 3/1989 | Japan . |
| 1-259592 | 10/1989 | Japan . |
| 2-17694 | 1/1990 | Japan . |
| 2-94696 | 4/1990 | Japan . |
| 2-119295 | 5/1990 | Japan . |
| 4-297090 | 10/1992 | Japan . |

*Primary Examiner*—Hyung-Sub Sough
*Attorney, Agent, or Firm*—Wenderoth, Lind & Ponack, L.L.P.

[57] ABSTRACT

Copper electrodes are formed on a circuit board to be bonded with leads of a TAB driving liquid crystal. A pre-deposit solder receiver having solder printed thereon is also provided on the circuit board in alignment with and prior to an electrode to be first bonded with a lead, to form a sufficient solder pool between plural electrodes and a bottom wall of a soldering iron. Solder/bonding is accordingly realized efficiently even from a starting electrode E1. Also, an excessive solder receiver may be provided in alignment with and after an electrode to be last bonded with a lead.

3 Claims, 12 Drawing Sheets

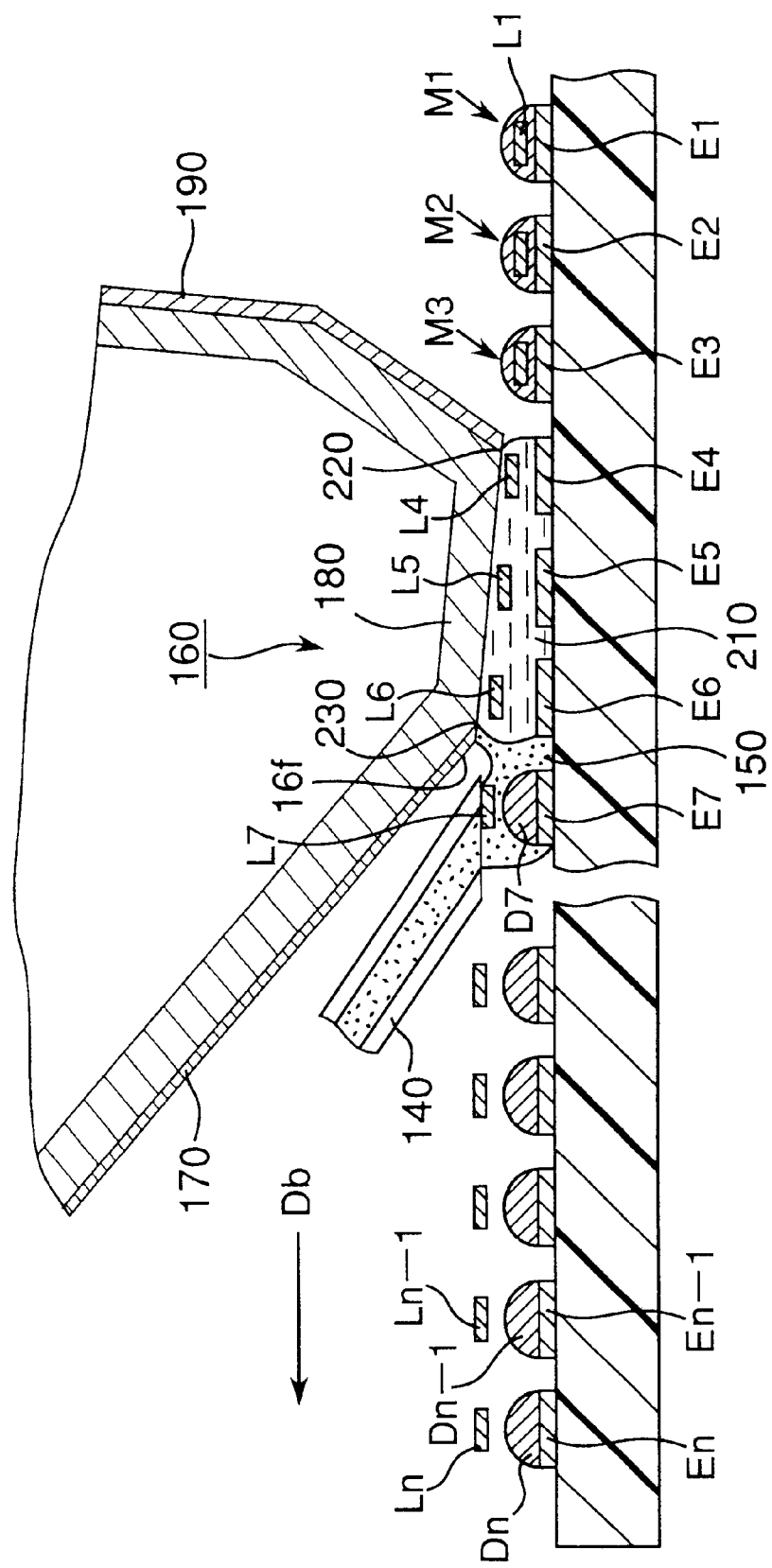

CIRCUIT BOARD HAVING ELECTRODES AND PRE-DEPOSIT SOLDER RECEIVER

BACKGROUND OF THE INVENTION

1. Field of the Invention

The present invention relates to a circuit board for mounting electronic parts thereon.

2. Description of the Prior Art

A technique called a TAB (Tape Automated Bonding) method has been primarily used to mount semiconductor devices, driving liquid crystal panels noted as image display apparatuses, on a circuit board. According to the TAB method, such semiconductor devices are supplied in the form of a TCP (tape carrier pack). The TCP is fitted by a FOB (Film On Board) to a circuit board that supplies a driving signal for the liquid crystal.

In FIG. 8A, a top view of a TCP for a liquid crystal driving device is shown. The liquid crystal driving TCP includes a resin film base 12a, and an IC 11 placed on an upper surface of the resin film base 12a. A predetermined number "n" of input leads L, spaced at a predetermined pitch Pl, are provided on the bottom surface of the resin film base 12a. Each of the input leads L extends from the input terminal of the IC through a predetermined hole formed in the base 12a and protrudes from the side of the base 12a. An elongating resin film 12b is further provided on the upper surface of ends of the thus protruded leads L.

Each of the input leads L has a predetermined width Wl, and is apart from the neighboring leads by a predetermined distance Il(Il=Pl–Wl). The input lead located at the right-most side in FIG. 8A is referred to as the first input lead L1. Hereafter, any one of the "n" number of input leads L is designated by a suffix "i", indicating the order counted from the first lead L1. Note that "i" is an integer greater than zero and less than "n+1". Therefore, the reference symbol for the final input lead is Ln.

As indicated by dot lines in FIG. 8A, a plurality of output leads 8 that are very similar to the input leads L but are extending in the opposite direction from the output terminals of the IC 11 are provided on the bottom surface of the resin film base 12a. The resin film base 12a, IC 11, input leads L and output leads 8 are firmly fixed by an insulating resin 10, as best shown in FIG. 6.

In FIG. 8B, a circuit board 130 according to the TAB method is shown. The circuit board 130 is provided with the same number n of copper electrodes E arranged on the upper surface of the circuit board 130 at the same pitch Pl as the input leads L of the TCP (FIG. 8A). Similarly, each of the copper electrodes E is referred to by the reference symbol E having a suffix indicating the order counted from the first lead E1 attached thereto. Therefore, the reference symbol of the final copper electrodes E arranged on the left-most side in FIG. 8B has the suffix n. Any of the copper electrodes E can be referred to by the reference symbol Ei.

The TCP and the circuit board 130 are positioned such that every input leads Li is located above corresponding electrode Ei when the TCP is mounted on the circuit board 130. Note that components mounted on the circuit board 130 other than the electrodes E are omitted from FIG. 8B for the sake of clarity.

In FIG. 8C, a cross-sectional side view of the circuit board 130, taken along a line IIXC—IIXC, of FIG. 8B with the TCP of FIG. 8A located above is shown on an enlarged scale. Every copper electrode Ei on the circuit board 130 is provided with a solder deposit D formed thereon. Moreover, an amount of the solder deposit D on each copper electrode E is maintained to be constant in order to bond the leads L and copper electrodes E in the same shape.

With reference to FIG. 7, the concept of solder-bonding thus prepared input leads L with electrodes E by using a soldering iron is described below. Note that FIG. 7 shows the cross-sectional view corresponding to FIG. 8C wherein the first three pairs of leads L1 to L3 and electrodes E1 to E3 are bonded by solder melted from the solder deposits, respectively, and three successive pairs of leads L4 to L6 and electrodes E4 to E6 are now under going the soldering operation.

Each copper electrode E is arranged on the circuit board 130 below the corresponding lead L of the TCP, as best shown in FIG. 8C. The bonding solder D of substantially the same amount and same form is deposited on each copper electrode E. Note that the direction Db is the direction in which the input leads L are arranged from the right-most side lead (first lead L1) to the left-most side lead (final lead Ln).

Then, a soldering iron 160 of oxygen free high conductivity copper and a flux pipe 140 are moved in alignment with each other in a direction Db indicated by an arrow Db. At this time, the soldering iron 160 which is heated over the melting point of the solder and flux pipe 140 are kept in a pressure contact with several leads L to press against the solder deposits D toward the electrodes E. The copper electrodes E and the leads L of the TCP are bonded by the solder in this way.

The bonding process is hence carried out while the soldering iron 160 which is heated over the melting point of the solder is moved together with the flux pipe 140, which will be described below in more detail.

While the flux pipe 140 is held in touch with the first lead L1, a flux 150 for removing an oxide film of the solder deposit D is fed to the first lead L1 from the flux pipe 14. Immediately after the flux 150 is supplied around the first lead L1 and solder deposit D1, a front end 220 of the heated soldering iron 160 comes in touch with the first solder deposit D1 on the copper electrodes E1, to thereby melt the first solder deposit D1. Thus molten first solder D1 wets an iron plating 180 at the front end 220 of the soldering iron 160 and forms a solder pool 210 between the iron plating 180 and the first copper electrode E1.

According to the movement of the solder iron 160 in the bonding direction Db, the second solder deposit D2 on the second electrode E2 is successively melted by the heated solder iron 160. Then, the solder pool 210 grows around the first and second electrodes E1 and E2. In the example shown in FIG. 7, since the solder iron 160 has the iron plated area 180 extending between both ends 220 and 230 wide enough for covering three copper electrodes E, the solder pool 210 grows between the soldering iron 160 and three electrodes E1, E2, and E3, for example, at the same time. Within the solder pool 210, the neighboring leads L are electrically short-circuited by the molten solder.

However, as the solder iron 160 moves in the direction Db, a black chromium plating 190 at the front end 220 of the soldering iron 160 contacts with the solder pool 210. When the soldering iron 160 reaches such a position where the black chromium plating 190 contacts with the solder pool 210 between the neighboring electrodes E1 and E2, the iron plated part 180 presses the fourth lead L4 against the fourth solder deposit D4. However the molten solder can not wet the black chromium plating 190 and the substrate of circuit board 130. Therefore, the solder pool 210 is divided into two portions owing to the surface tension thereof.

The first portion is kept away from the solder pool 210 covering the second and third electrodes E2 and E3 by the black chromium plating 190. The second portion is the solder pool 210 extending from the second electrode E2 to the fourth electrode E4, wherein the molten solder melted from the fourth deposit D4 by the solder iron 160 is additionally included.

In this case, the first portion of molten solder separated from the solder pool 210 wets the first electrode E1 and lead L1, and fits them closely together. Thus, the electrode E1 and lead L1 are fitted closed together and joined by the molten solder distributed between the fitted surface thereof by capillary attraction. After the joined parts cool, the molten solder solidifies to form a first soldered mount M1 wherein the lead L1 and electrode E1 are firmly bonded.

In order to secure a stable soldering quality, it is required to form the solder pool 210 sufficiently at the front end 220 of the soldering iron 160 and also provide the black chromium plating 190 at the front end 220 of the soldering iron. That is, every copper electrode E on the circuit board 130 was used for bonding with the leads L. Moreover, an amount of the solder formed on each copper electrode E was maintained to be constant in order to bond the leads L and copper electrodes E in the same shape.

FIGS. 9A, 9B, 9C, and 9D illustrate an operation for bonding the thus constructed conventional circuit board 130 with the TCP shown in FIGS. 8A, 8B, and 8C. FIG. 9A shows that the first three pairs of leads L1 to L3 and electrodes E1 to E3 are subject to the soldering operation. The solder deposits D1 to D3 formed on the electrodes E1 to E3 are melted by the heated solder iron 160 and form the solder pool 210 distributed between the iron plated surface 180 and the electrodes E1 to E3. The flux 150 is supplied to the fourth deposit D4 and the solder pool 210. The thus formed solder pool 210 is pressed by the slanted surface of the iron plated surface of the soldering iron 160 in the soldering direction Db. According to the proceeding of the soldering operation, the soldering iron 160 is fed in the direction Db so that not a negligible amount of the molten solder of the solder pool 210 is conveyed from the first electrode E1.

Since the movement of the molten solder from the preceding electrodes is accumulatively repeated as the iron 160 moves, a smaller amount of molten solder will be resident on the preceding electrodes Ei than that on the following electrode Ei+1. In this sense, there is a tendency for preceding pairs of electrode E and lead L to not have enough of molten solder to form the solder mount M. Since any electrode Ei except the first electrode E1 is supplied with the molten solder conveyed from the preceding electrodes Ei−1, such shortage of molten solder can be compensated. However, it is to be noted that the first electrode E1 has no preceding electrode which can supply the solder.

FIG. 9B shows the bonding condition of the first three respective pairs of leads L1 to L3 and electrodes E1 to E3 after the soldering operation. As described above, an insufficient amount of molten solder is left on the first lead L1 and electrode E1 for being distributed therebetween. As a result, the first solder mount M1 can not be formed completely to join the lead L1 and electrode E. However, the following two solder mounts M1 and M2 can be formed for joining the leads L2 and L3 and electrodes E2 and E3, respectively.

FIG. 9C shows the final stage of the soldering operation whereat the soldering iron 160 is located over the last three pairs of leads Ln-2, Ln-1, and Ln and electrodes En-2, En-1, and En. The molten solder not used for forming the solder mount Mi is conveyed to the following electrodes Ei+1 for forming the following mount Mi+1, as described above. Therefore, the solder pool 210 resident around the last three electrodes En-2, En-1, and En includes the remaining part of all preceding solder deposits D1 to Dn-1 not used for mount formation. In other words, the molten solder in the solder pool 210 accumulatively increases each time when the solder mount M is formed.

FIG. 9D shows the bonding condition of the last three pairs of leads Ln-2 to Ln and electrodes En-2 to En after the soldering operation. Since there is no further electrode for joining by the solder, such excessive solder can not be conveyed to anywhere. Therefore, all the molten solder included in the solder pool 210 should be used for forming the last mounts Mn, Mn-1, and Mn-2. As a result, at least two of final mounts are essentially connected by the excessive solder, resulting in short-circuits. Note that such a short-circuit between adjacent mounts Mi and Mi+1 by the excessive solder is not limited to the final stage but can be generated at any stage of bonding operation.

As described above, an amount of the solder M formed on each copper electrode E was maintained constant in order to bond the leads L and copper electrodes E in the same shape. According to the conventional arrangement, the solder pool 210 is not yet sufficiently obtained at the front end 220 of the soldering iron 160 when bonding is started. As typically shown in FIG. 8A, the starting lead L sometimes fails to be properly bonded. This is a problem of the prior art at the beginning of bonding.

During bonding, when the front end 220 of the soldering iron 160 continues bonding, an amount of the solder pool 210 formed at the front end 220 of the soldering iron 160 is increased. As typically shown in FIG. 8B, a short-circuit is generated between the adjacent mounts by the excessive solder in the latter stage of bonding.

Further, since the soldering iron 160 keeps moving in touch with the circuit board 130 even after passing the final lead Ln of FIG. 8, the solder pool 210 accumulated at the front end 220 of the soldering iron 160 overflows to drop on the circuit board 130, thereby giving rise to an inconvenient adhesion of unnecessary solder to the circuit board 130.

SUMMARY OF THE INVENTION

The object of the present invention is therefore to provide a connector which solves these problems.

The present invention has been developed with a view to substantially solving the above described disadvantages and has for its essential object to provide an improved circuit board.

In order to achieve the aforementioned objective, a circuit board comprises a plurality of electrodes formed in the same shape and aligned on a line; and a storage means provided beside one of aligned ends of said electrodes for storing a bonding material for bonding the electrode to an electric part.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 7 is an illustration for use in explaining the solder bonding of the circuit board with a TCP by the used of a soldering iron.

DETAILED DESCRIPTION OF THE PREFERRED EMBODIMENTS

Figure 1A:
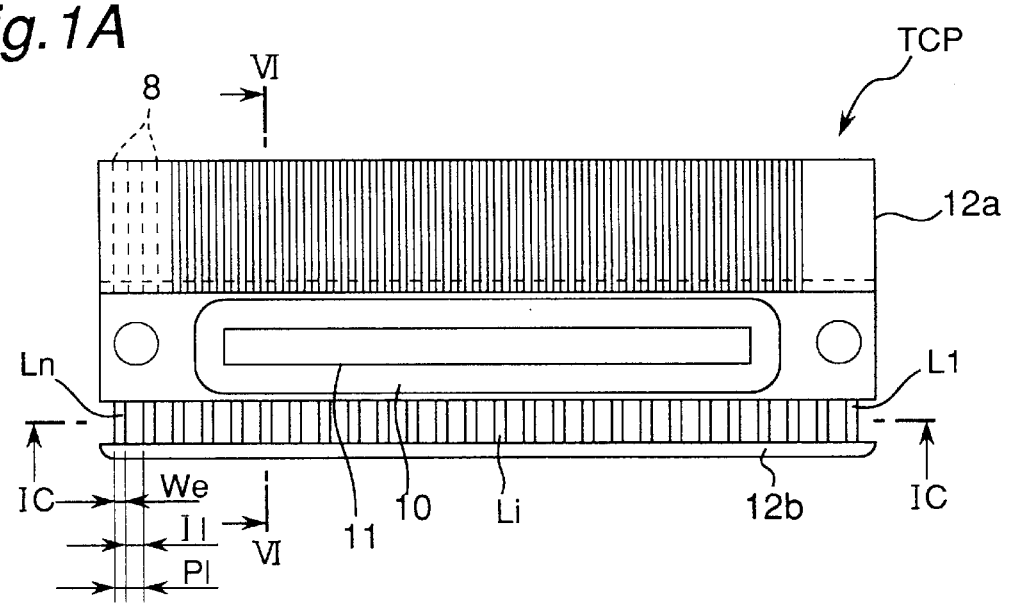
FIG. 1A is a plan view showing a TCP for a liquid crystal driving device according to the present invention.

Referring to FIG. 1A, a top view of a TCP (tape carrier pack) for a liquid crystal driving device according to the present invention is shown. This TCP is mounted to a circuit board by a TAB (Tape Automated Bonding) method. The liquid crystal driving TCP includes a resin film base 12a such as a polyamide resin film, and an IC 11 placed on an upper surface of the resin film base 12a. A predetermined number n of input leads L, spaced at a predetermined pitch Pl, are provided on the bottom surface of the resin film base 12a. Each of the input leads L extends from the input terminal of the IC 11 through a predetermined hole formed in the resin base 12a and protrudes from the side of the base 12a. An elongate resin film 12b such as a polyamide resin film is further provided on the upper surface of ends of the protruded leads L.

Each of input leads L has a predetermined width Wl, and is apart from the neighboring leads by a predetermined distance Il(Il=Pl−Wl). In this example, the predetermined number n, pitch Pl, width Wl, and distance Il are set to 26, 0.75, 0.3, and 0.45, respectively. Note that the input leads L are arranged from the right-most side lead (first lead L1) to the left-most side lead (final lead Ln).

The input lead L located on the right-most side in FIG. 1A is referred to as the first input lead L1. Hereafter, any one of "n" number of input leads L is designated by a suffix "i", indicating the order counted from the first lead L1. Note that "i" is an integer greater than zero and less than "n+1". Therefore, the reference symbol for the final input lead is Ln. The first and final electrodes E1 and En correspond to starting and final electrodes which are particularly set with respect to a moving direction of a soldering iron in a bonding operation.

As indicated by dot lines in FIG. 1A, a plurality of output leads 8 which are very similar to the input leads L but are extending in the opposite direction from the output terminals of the IC 11 are provided on the bottom surface of the resin film base 12a. The resin film base 12a, IC 11, input leads L and output leads 8 are firmly fixed by an insulating resin 10.

Figure 1B:
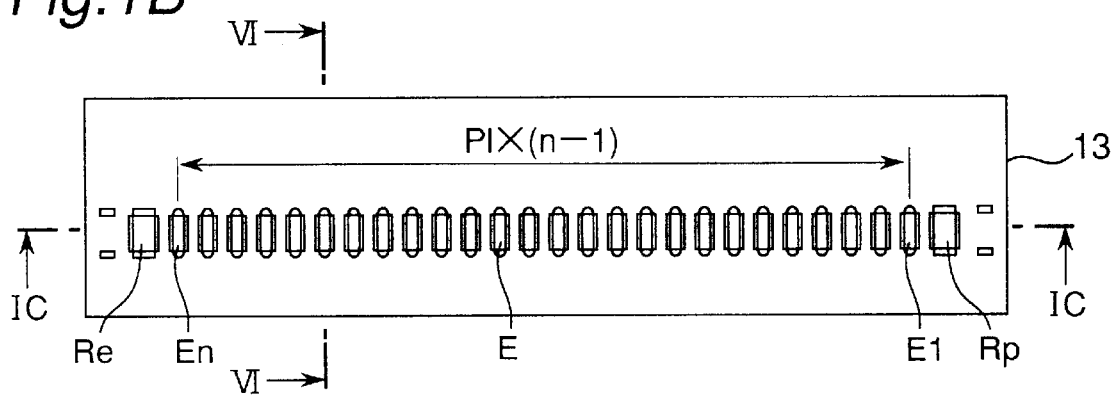
FIG. 1B is a plan view showing a circuit board according to the present invention.

Referring to FIG. 1B, a fragmentary top view of a circuit board 13 according to the present invention, used for mounting the TCP of FIG. 1A by the TAB method, is shown. The circuit board 13 is provided with the same number "n" of copper electrodes E arranged on the upper surface thereof at the same pitch Pe as the pitch Pl of input leads L of TCP (FIG. 1A). Note that the electrodes E are arranged from the right-most side lead (first electrode E1) to the left-most side lead (final electrode En). Similarly, each of copper electrodes E is designated with the reference symbol E having a suffix indicating the order counted from the first lead E1. Therefore, the reference symbol of the final copper electrode E arranged on the left-most side lead in FIG. 1B has the suffix n and is thus designated as En. The first electrode E1 and final electrode En correspond to the first lead L1 and final lead Ln on the TCP, respectively.

Any of the copper electrodes E can be referred to by the reference symbol Ei. Every copper electrode Ei is provided with a solder deposit D formed by printing thereon. Moreover, an amount of the solder deposit D on each copper electrode E is maintained constant in order to bond the leads L and copper electrodes E in the same shape.

A pre-deposition receiver (or pre-deposition bonding material holder) Rp with the solder Dp printed thereon is additionally provided at a position immediately before the starting electrode E1. According to this embodiment, an area of the pre-deposition receiver Rp is set to be twice that of the copper electrode E used for bonding. The reason why the area of the pre-deposition receiver Rp is double that of the electrode E will be explained later with reference to FIGS. 4 and 5.

A excessive solder receiver (or excessive bonding material receiver) Re in which no solder is printed is additionally provided at a position immediately after the final electrode En. The excessive solder receiver Re is constituted of a material that can be wetted by the molten solder, and has generally twice the area of the copper electrode E used for bonding. The reason why the area of the excessive solder receiver Re is double that of the electrode E will be described later.

Figure 1C:
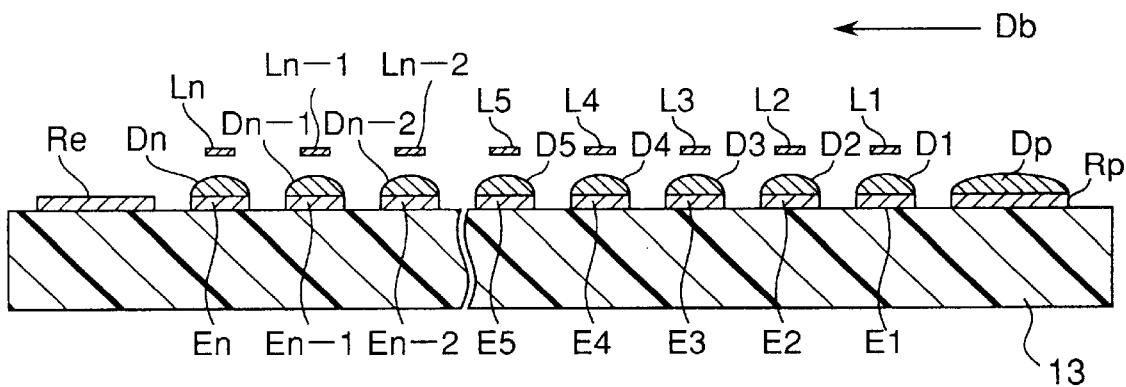
FIG. 1C is a cross-sectional view of the circuit board of FIG. 1B, taken along a line IC to IC, with the TCP of FIG. 1A located above.

Referring to FIG. 1C, a cross-section al side view of the circuit board 13, taken along a line IC–IC, of FIG. 1B with the TCP of FIG. 1A located above is shown on an enlarged scale. Each of the input leads Li is located above corresponding electrode Ei such that the first and final leads L1 and Ln are located above the first and final electrodes E1 and En, respectively.

Every copper electrode Ei on the circuit board 13 is provided with a solder deposit Di formed thereon. There are no leads above the pre-deposition receiver Rp and the excessive solder receiver Re. Note that an arrow Db indicates a direction in which the leads L are bonded to the electrodes E, from the right-most side ones (first lead Ll and electrode E1) to the left-most side ones (final lead Ln and electrode En). In this sense, the first lead L1 and electrode E1 can be referred to as the bonding starting lead and electrode, respectively.

Figure 6:
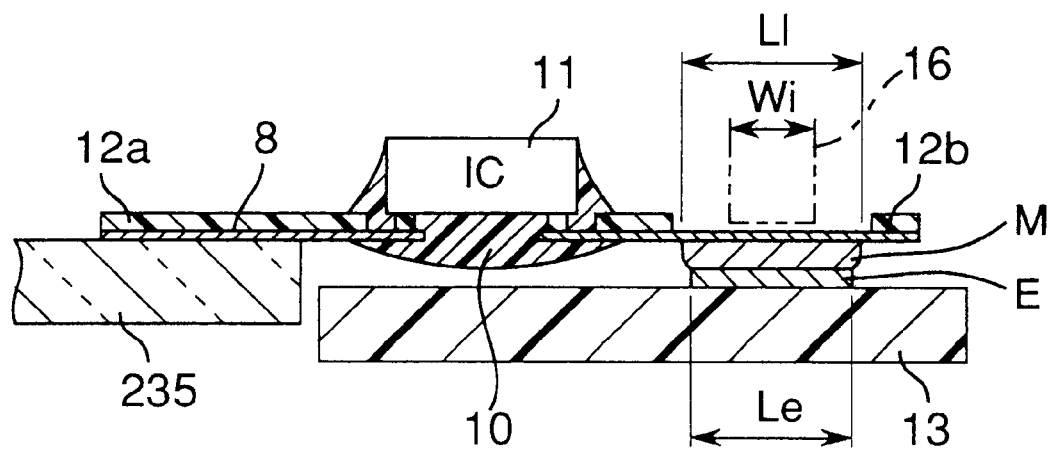
FIG. 6 is a cross sectional view of an example of the TCP, taken along a line VI—VI of FIG. 1A.
Figure 8A:
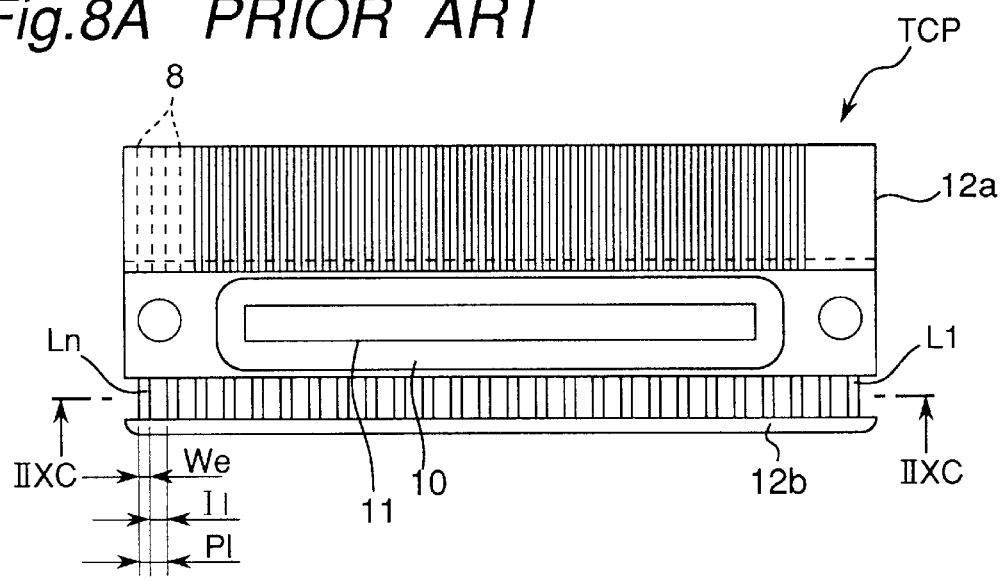
FIG. 8A is a plan view showing a TCP for a liquid crystal driving device to be mounted to a conventional circuit board.
Figure 8B:
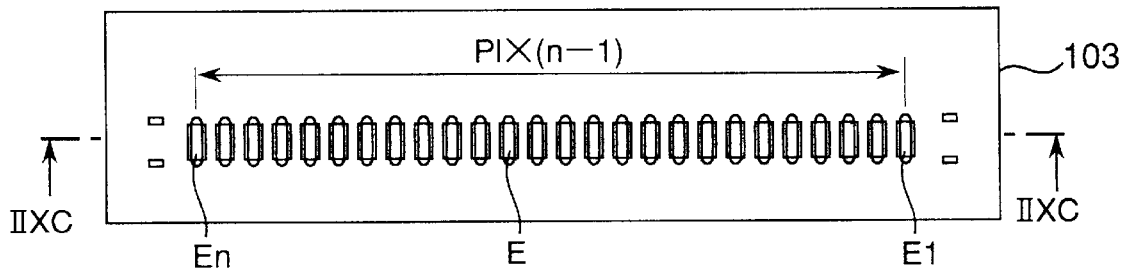
FIG. 8B is a plan view showing a conventional circuit board.
Figure 8C:
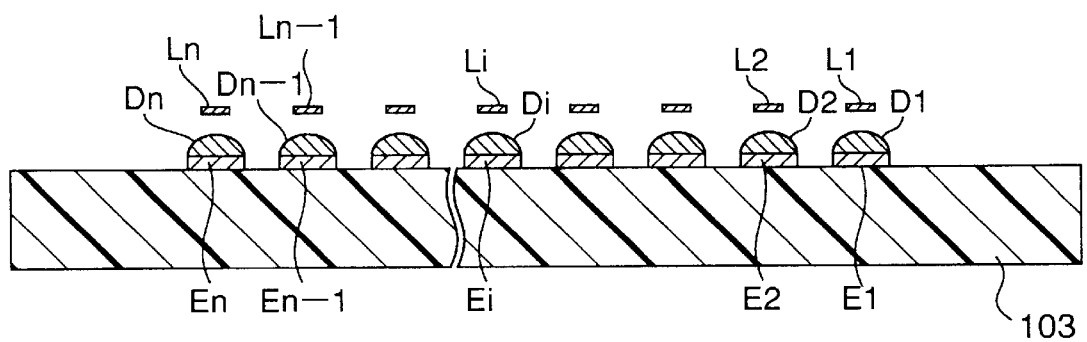
FIG. 8C is a cross-sectional view of the circuit board of FIG. 8B, taken along a line IIXC to IIXC, with the TCP of FIG. 8A located above.
Figure 9A:
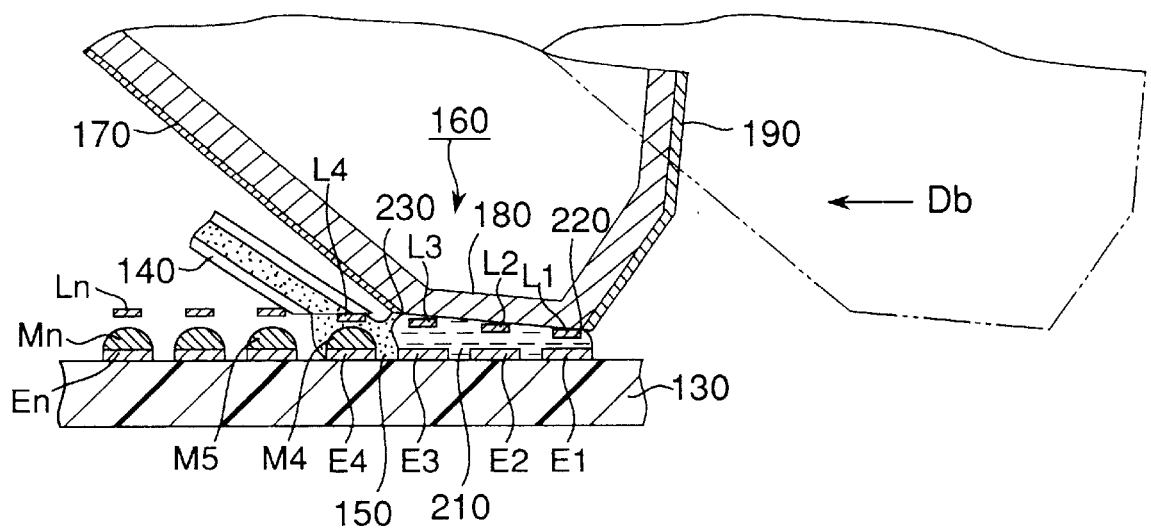
FIGS. 9A, 9B, 9C, and 9D are illustrations for use in explaining the operation of bonding a conventional circuit board of FIG. 8B with the TCP of FIG. 8A.
Figure 9B:
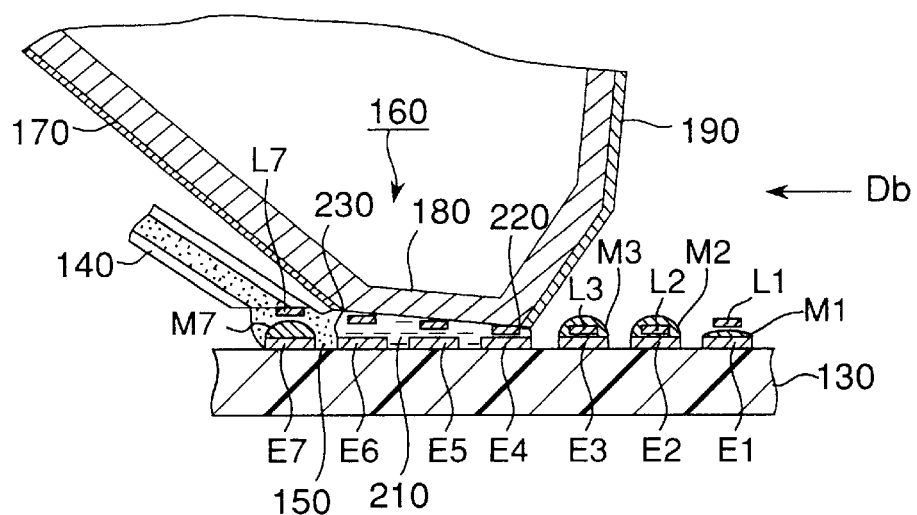
Figure 9C:
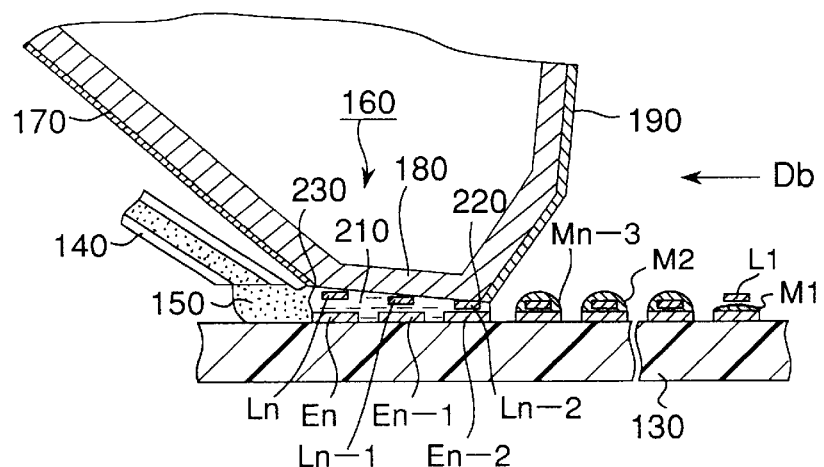
Figure 9D:
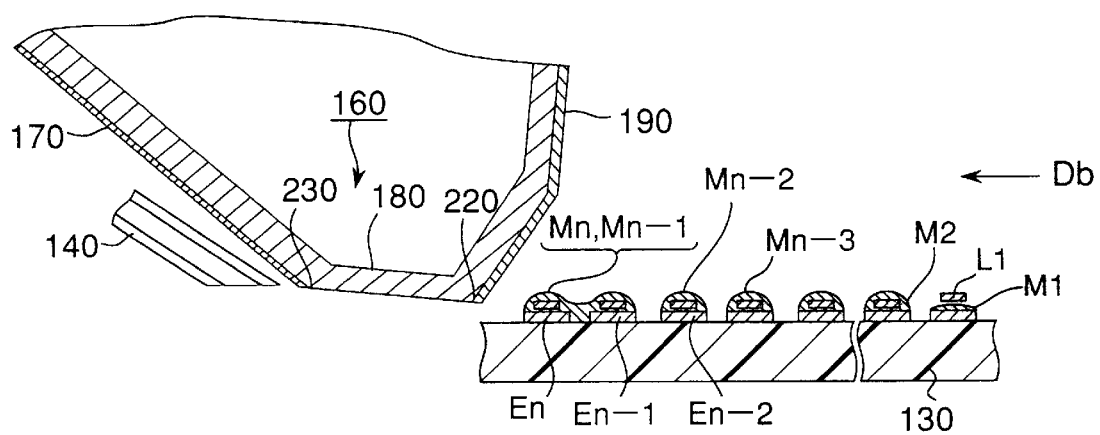

Referring to FIG. 6, a cross-sectional view of the TCP of FIG. 1A, taken along a line VI—VI, ideally bonded with the circuit board 13 of FIG. 1B by the TAB method is shown. The TCP is mounted on the circuit board 13 such that the input leads Li of the TCP are bonded with the corresponding copper electrode Ei on the circuit board 13 by the molten solder deposit Ei. The output leads 8 are located on a glass panel of liquid crystal display 235. As best shown in FIG. 6, each electrode E is elongate in a direction substantially parallel to the lead L and has a predetermined length Le. The resin films 12a and 12b are provided on the upper surface of each lead L at a predetermined interval Ll. In other words, the lead L is exposed for the bonding operation by length Ll. For example, a soldering iron 16 having a predetermined width Wi is placed within this exposed area, as indicated by an imaginary line.

The thus constructed liquid crystal display apparatus operates in the following manner. An electric signal for driving liquid crystal 235 is input to an input electrode of the IC 11 from the copper electrodes E on the circuit board 13 via the solidified solder 20 and the bonded lead L. The electric signal converted within the IC 11 is then output to the liquid crystal panel 235 from the output terminal through the output leads 8.

Figure 10:
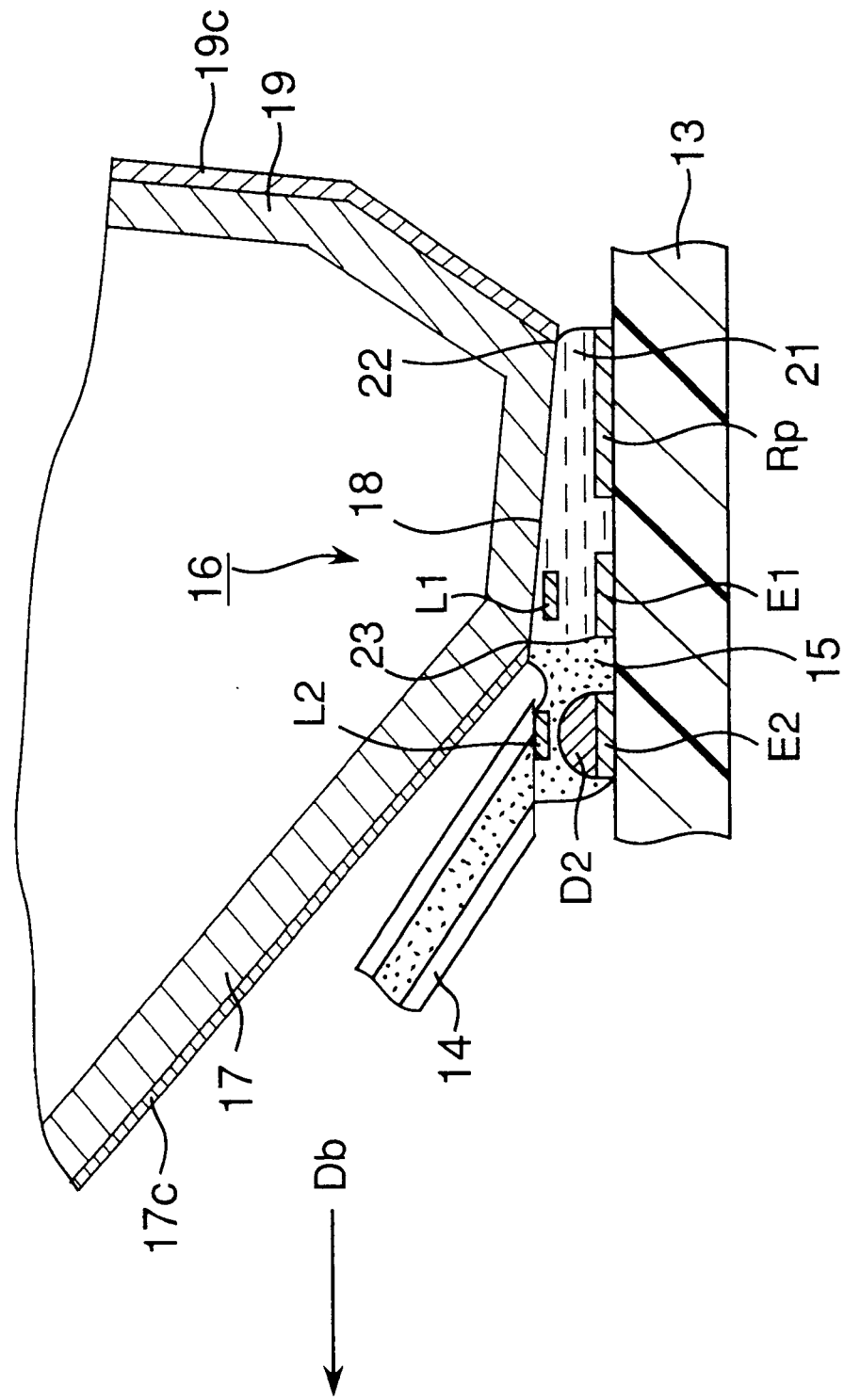
FIG. 10 is an illustration for use in the solder bonding, according to the present invention, of the circuit board of FIG. 1B with a TCP of FIG. 1A by the use of a soldering iron.

With reference to FIG. 10, the solder-bonding according to the present invention is described. Note that FIG. 10 is a cross-sectional view corresponding to FIG. 1C wherein the first pair of leads Li and electrodes E1 are being bonded by a solder iron 16 with the molten solder.

The soldering iron 16 has a tip made of oxygen free high conductivity copper for heating the solder to melt the solder and pressing the leads toward the electrode E, so that the thus melted solder distributed between the electrode E and lead L. The tip is formed in a polygonal shape in cross section, and has an iron plating thereon. The shape of the tip is preferably defined by five walls, a bottom wall 18, a front wall 17, a back wall 19, and two side walls (not shown).

The bottom wall 18 is flat and wide enough for contacting (melting) three solders deposits D at one time in order to prevent the iron tip 16 from falling down on a surface of the circuit board 13 between the electrodes E. Otherwise, if the iron tip 16 fall between electrodes E it would strike the lead L in the moving direction Db. The bottom wall 18 is slanted with respect to the moving direction Db of the iron, such that the bottom wall 18 diverges from the circuit board 13 along the moving direction Db. As best shown in FIG. 10, for example, the distance between bottom wall 18 and the circuit board 13 is the greatest at the front (left) side edge 23 and the smallest at the back (right) side edge 22 thereof. Thus, the preceding side with respect to the moving direction Db is referred to as a "front side", and the other side is referred to as a "back side".

The front and back walls 17 and 19 extend upwardly from the front and back side edges 23 and 22 of the bottom wall 18, respectively. Both the front and back walls 17 and 18 are provided with coatings 17c and 19c, respectively. These coatings are made of such a material as a black chromium plating that cannot be wetted by the molten solder.

A flux pipe 14 for supplying a flux 15 is provided near the front side edge 23 of the soldering iron 16 so as to move in alignment with the soldering iron 16 in the soldering direction Db. Thus, the soldering iron 16 which is heated over the melting point of the solder and flux pipe 14 are kept in a pressure contact with several leads L to press against the solder deposits D toward the electrodes E. The copper electrode E and the lead L of the TCP are bonded by the solder in this way. The bonding process will be described below in more detail.

First of all, the flux pipe 14 is in touch with the pre-deposition receiver Rp and the first lead L1, and feeds the flux 15 for removing an oxide film of the solder Dp printed on the pre-deposition receiver Rp. According to the movement of the iron 16 in the direction Db, the flux pipe 14 contacts the first lead L1 and supplies the flux 15 therearound. At the same time, the solder Dp on the pre-deposition receiver Rp is in touch with the bottom wall 18 of the heated soldering iron 16, and is melted. The molten solder melted from the deposit Dp wets the bottom wall 18 of iron plating but not the front and back walls 17 and 19 which are coated with the black chromium. Therefore, the molten solder is distributed between the bottom wall 18 and the pre-deposition receiver Rp, and forms a solder pool 21.

According to the movement of the solder iron 16 in the bonding direction Db, the first solder deposit D1 on the first electrode E1 is successively melted by the heated solder iron 16. Then, the solder pool 21 includes the solder melted from first deposit D1 and extends from the pre-deposition receiver Rp to the first electrode E1. Note that the bottom wall 18 is wide enough for covering three electrodes corresponding to the pre-deposition receiver Rp and the first electrode E1.

However, as the solder iron 16 further moves in the direction Db, the back edge 22 at the top of the back wall 19 plated with the black chromium plating contacts the solder pool 21. When the soldering iron 16 reaches such a position where the back edge 22 contacts with the solder pool 21 between the pre-deposition receiver Rp and the first electrode E1, the bottom wall 18 presses the second and third leads L2 and L3 against the second and third solder deposits D2 and D3, respectively. Thus the solder deposits D2 and D3 are melted by the iron 16. However the molten solder can not wet the black chromium plating of the front and back walls 17 and 19 and the substrate of circuit board 13. Therefore, the solder pool 21 is divided into two portions owing to the surface tension thereof.

The first portion is kept away from the solder pool 21 covering the first electrode E1 by the back wall 19 coated with the black chromium plating. The second portion is the solder pool 21 extending from the first electrode E1 to the third electrode E3, wherein the molten solder melted from the deposits D2 and D3 by the solder iron 16 is additionally included.

In this case, the first portion of molten solder separated from the solder pool 21 can wet the pre-deposition receiver Rp only, because there is no member such as a lead L available. Therefore, a small amount of molten solder can stay on the pre-deposition receiver Rp owing to the capillary attraction. As a result, the remaining amount of molten solder other than that staying on the pre-deposition receiver Rp is conveyed to the first electrode E1 by the soldering iron 16, and is included in the solder pool 21 thereat.

As the solder iron 16 further moves in the direction Db, and the back edge 22 contacts with the solder pool 21 between the first and second electrodes E1 and E2. Similarly, the fourth lead L4 is pressed against the fourth solder deposit D4 which will be melted. The solder pool 21 extending from the first electrode E1 to the fourth electrode E4 is divided into two portions by the back edge 22 of the iron 16.

The first portion covers the first electrode E1, and the second portion covers the second to fourth electrodes E2 to E4. The molten solder in the first portion wets the first electrode E1 and lead L1, and fits them closely together. Thus, the electrode E1 and lead L1 are fitted close together and joined by the molten solder distributed between the fitted surface thereof by capillary attraction. After the joined parts cool, the molten solder solidifies to form a first soldered mount M1 wherein the lead L1 and electrode E1 are firmly bonded.

With reference to FIGS. 11A, 11B, 11C, and 11D, the operation for bonding the circuit board 13 with the TCP of FIG. 1A is described.

Figure 11A:
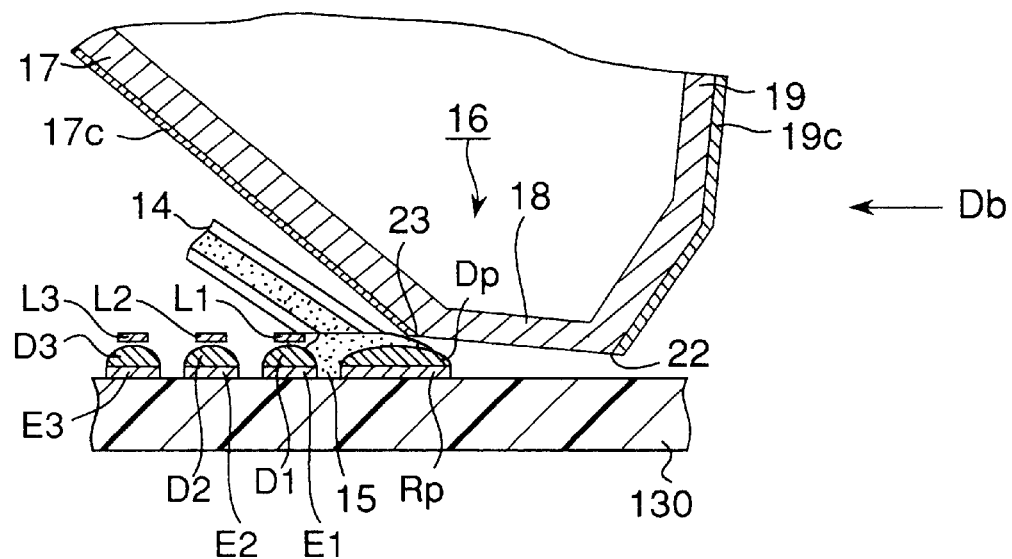
FIGS. 11A, 11B, 11C, and 11D are graphs for use in explaining the operation of bonding the circuit board according to the present invention.

Referring to FIG. 11A, the circuit board 13 and the TCP just before the soldering operation are shown. First of all, the pre-deposition receiver Rp is successively in touch with the flux pipe 14 and the soldering iron 16. The solder Dp on the supply E is melted by the bottom wall 18 of the iron 16.

Figure 11B:
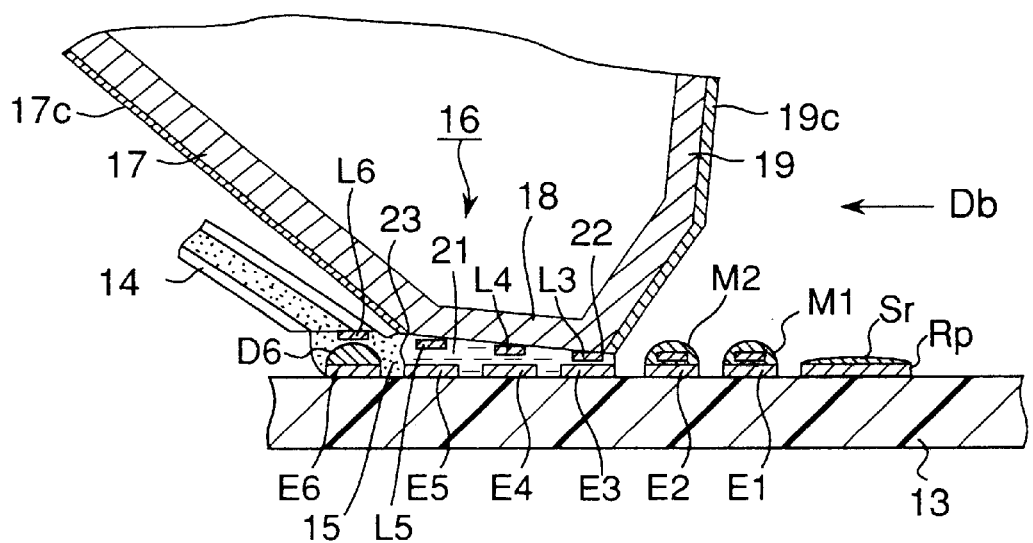

Referring to FIG. 11B, the bonding condition of the first two pairs of leads L1 to L2 and electrodes E1 to E2 is shown. As described above, a considerable amount of solder melted from the deposit Dp on the pre-deposition receiver Rp is fed to the solder pool 21 extending from the first to third electrodes E1 to E3. On the receiver Rp, a small amount of solder deposit Sr remains. Therefore, the loss of the molten solder conveyed by the iron 16 from the first to the second electrodes E1 to E2 can be compensated for by the solder from the pre-deposition receiver Rp. Thus, the molten solder sufficient for distributing between the lead L1 and the electrode E1 is resident even after the soldering iron 16 moves to the next (second) electrode E2. As a result, the first mount M1 can be formed completely without mis-joining the lead L1 and the electrode E1.

Since the remaining molten solder which is not used for forming the mount Mn is accumulatively conveyed to the next electrode Ei+1 as specifically described with reference to FIG. 1A, the electrodes following the current electrode Ei are supplied with a sufficient amount of the molten solder.

Figure 11C:
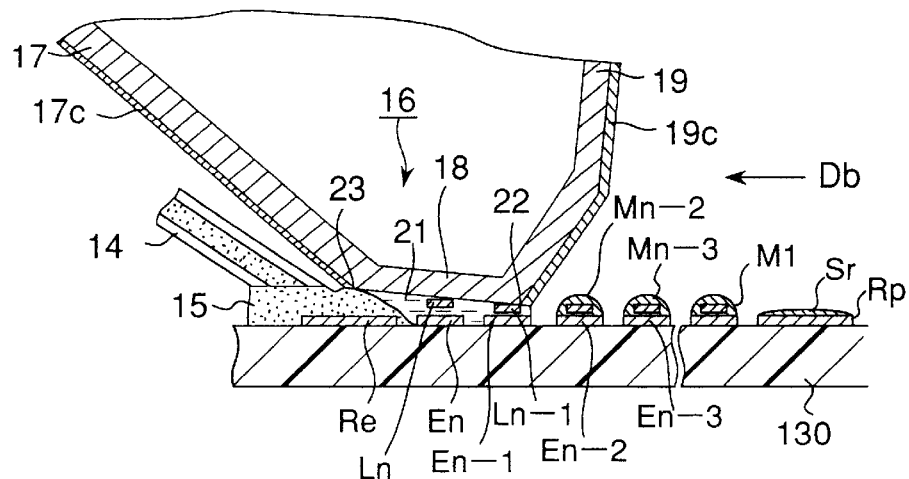

FIG. 11C shows the final stage of the soldering operation just prior to the soldering iron 16 soldering the penultimate pair of lead Ln-1 and electrode En-1. At this time, the bottom wall 18 of the iron 16 covers the area extending from the penultimate electrode En-1 to half-way along the excessive solder receiver Re. Since the excessive solder receiver Re is not printed with solder, no additional solder is supplied to the solder pool 21 distributed between the two electrodes En-1 and En and the bottom wall 18.

When the back edge 22 moves between the two electrodes En and En-1, the penultimate mount Mn-1 is formed in the same manner as those for the following mounts. In this time, the remaining solder pool 21 which is not used for the penultimate mount Mn-1 is conveyed to the final pair of electrode En and lead Ln.

Further when the back edge 22 moves between the final electrode En and the excessive solder receiver Re, the final mount Mn is formed. The molten solder which is not used for the final mount Mn is conveyed to the excessive solder receiver Re.

Figure 11D:
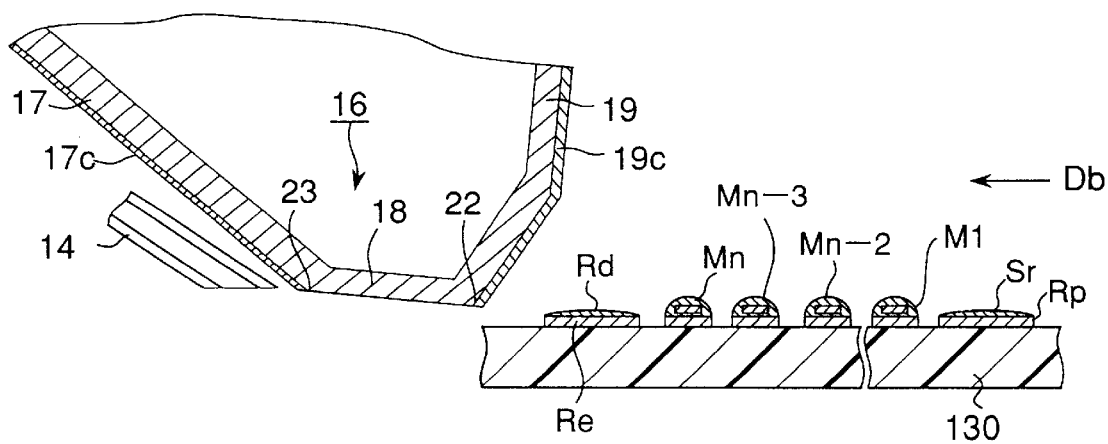

Referring to FIG. 11D, the circuit board 13 and the TCP just after the soldering operation is shown. The excessive solder receiver Re can receive the finally remaining excessive solder conveyed from the final electrode En because no solder is printed thereto. Therefore, such excessive solder can stay on the receiver Re as a solder deposit Rd, and is preventing from adding to the final or penultimate mounts Mn or Mn-1.

Figure 4:
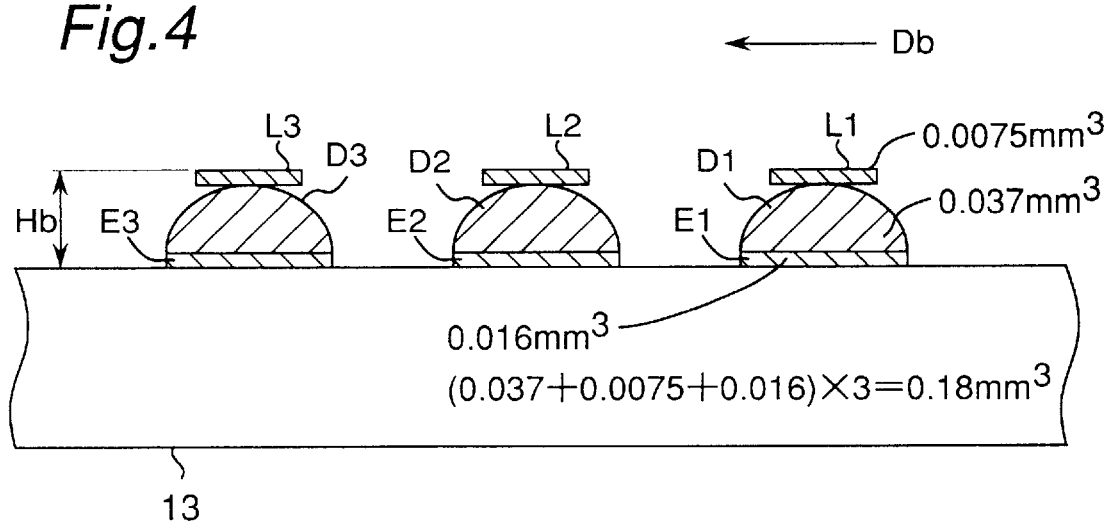
FIG. 4 is a cross-sectional side view showing the first three leads of FIG. 1A placed on the corresponding solder deposits formed on the first three electrodes of the circuit board of FIG. 1B.

Referring to FIG. 4, the first three electrodes E1, E2, and E3 immediately before being bonded are shown. Corresponding leads L1, L2, and L3 are pressed against the deposits D1, D2, and D3, respectively, by the soldering iron 16 (not shown for the sake of clarity). In this case, a top surface of the lead L is located at a predetermined height Hb above the circuit board 13. The volume occupied by the copper electrode E, lead L and solder 20 on the electrode E, including the starting electrode E1 and starting lead L1 in a 1 mm width of the back edge 22 of the soldering iron 16 and an approximately 2 mm distance from the first to third copper electrodes E1 to E3, is 0.18 mm$^3$, as indicated in FIG. 4.

Figure 5:
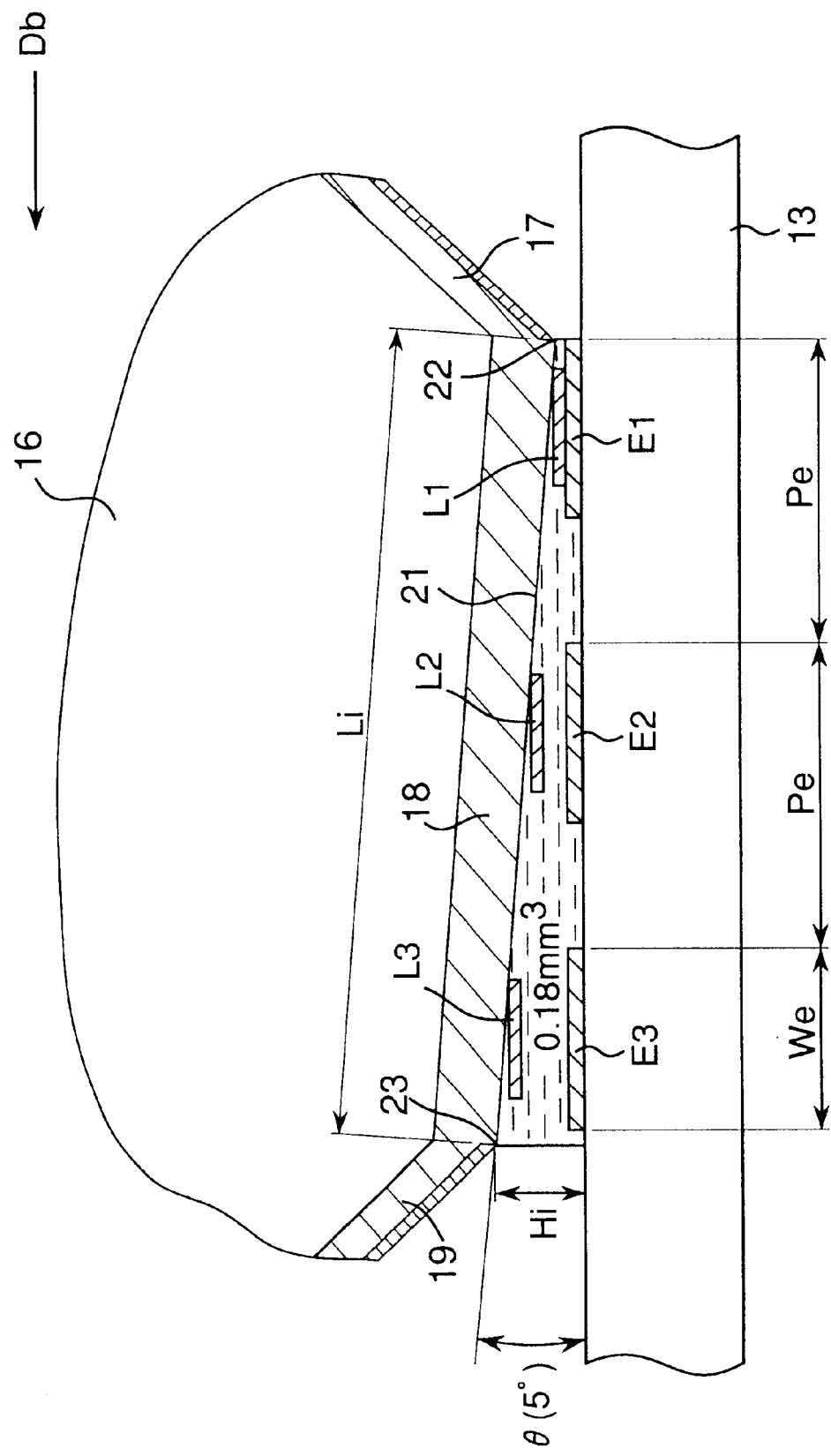
FIG. 5 is a cross-sectional side view showing a soldering iron located over the first three electrodes with the first three solder deposits melted and distributed therebetween.

Referring to FIG. 5, the soldering iron 16 placed over the first three electrodes E1 to E3 is shown. The electrodes E are spaced at the predetermined pitch Pe, and each has a predetermined width We. The bottom wall 18 of soldering iron 16 is inclined at a predetermined angle $\theta(\theta=5０$ in this example), so that the front edge 23 is located at a predetermined height Hi measured from the circuit board 13. The length of bottom wall 16 is set to a predetermined length Li.

In this case, the three deposits D1 to D3 are melted by the soldering iron 16 into the solder pool 21 which is distributed in a space defined by the bottom wall 18 and the circuit board 13. Meanwhile, a volume of the solder pool 21 is 0.18 mm$^3$ when a contact angle of the bottom wall 18 with respect to the circuit board 13 is set to be 5°. The optimum solder pool 21 is thus obtained by an amount of the solder formed in the area of the three electrodes E1 to E3. From this fact, the pre-deposit receiver Rp for the purpose of supplying the solder, not for bonding, is generally set to be of an area corresponding to two of the three copper electrodes E1 to E3. The thus-constituted circuit board therefore avoids bonding failure of the starting lead L1. So long as the volume of the solder pool 21 between the bottom wall 18 of the soldering iron 16 and the circuit board 13 corresponds with that of the to-be-bonded body, even the pre-deposit receiver Rp of an area of one copper electrode E realizes good bonding.

As described above, the excessive solder receiver Re in which no solder is printed is additionally disposed at a position where the back edge 22 passes immediately after bonding the final electrode En, as shown in FIG. 1C. This receiver Re effectively prevents the solder from dropping from the solder pool 21 after the final electrode En is bonded. The solder receiver Re is constituted of a material which can be wetted by the molten solder, and no solder print printed thereon. The receiver Re has generally twice the area of the copper electrode E used for bonding.

The reason why the area of the receiver Re is twice that of the electrode is the same as described with reference to the pre-deposit solder receiver Rp. That is, a maximum amount of the solder accumulated at the bottom wall 18 is an amount of the solder printed on the three copper electrodes. Furthermore, an amount of the solder remaining at the bottom wall 18 after bonding the final electrode En is an amount of the solder formed on two electrodes at maximum. This is because the solder of one electrode is used to bond the final electrode En with the final lead Ln.

If the pre-deposit solder receiver Rp has twice the area of the bonding electrode E, the excessive solder receiver Re is also set to have twice the area. When the pre-deposit receiver Rp has the same area as the bonding electrode E, the excessive solder receiver Re alike is designed to be of the same area.

The relationship between the amount of solder deposits D on the electrodes E and the bottom wall 18 of solder iron 16 can be generalized as follows.

An area St of a triangle defined between the bottom wall 18 and the circuit board 13 shown in FIG. 5 is expressed by the following equation.

$$St = \frac{1}{2} Li \sin\theta \times Li \cos\theta \tag{1}$$

Since a space defined by this area St is occupied by the solder melted from the deposits D included therein, the number Nd of deposits D therein is expressed by the following equation.

$$Nd = (Li \cos\theta - We)/Pe + 1 \tag{2}$$

When each lead L, deposit D, and electrode have predetermined cross-sectional areas Sl, Sd, and Se, the total amount (cross-sectional areas) of these three deposits D1 to D3 equals the volume under the bottom wall. Therefore, the following equation is obtained.

$$\text{Equation } (1) = (Sl + Sd + Se) \times Nd \tag{3}$$

From equation (3), the following equation is deprived.

$$\frac{1}{2} Li^2 \times \frac{1}{2} \sin 2\theta = (Sl + Sd + Se) \times Nd \tag{4}$$

Therefore, $$\theta = \frac{1}{2} \sin^{-1}\{4N (Sl + Sd + Se)/Li^2\} \tag{5}$$

However, the lengths of lead Ll and electrode Le and the width Wi of solder iron 16 are respectively set as best shown in FIG. 6. The following equations are also obtained.

$$Wi \leq Ll \text{ AND } Wi < Le \tag{6}$$

$$Hb \leq Hi \tag{7}$$

According to this embodiment, the amount of deposits D can be determined according to the equations (2), (5), (6), and (7).

Figure 2A:
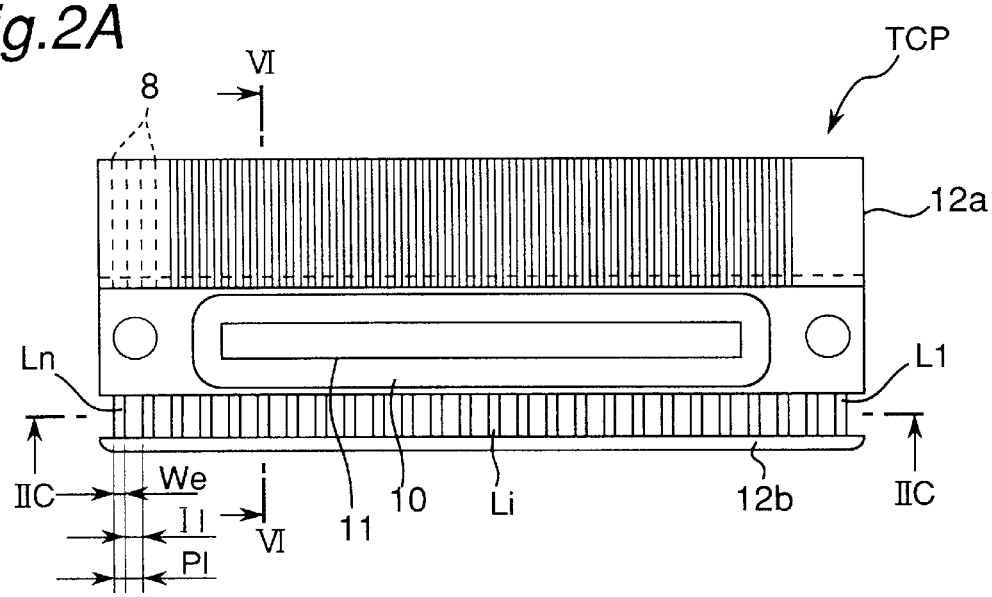
FIG. 2A is a plan view showing another TCP for a liquid crystal driving device according to the present invention.
Figure 2B:
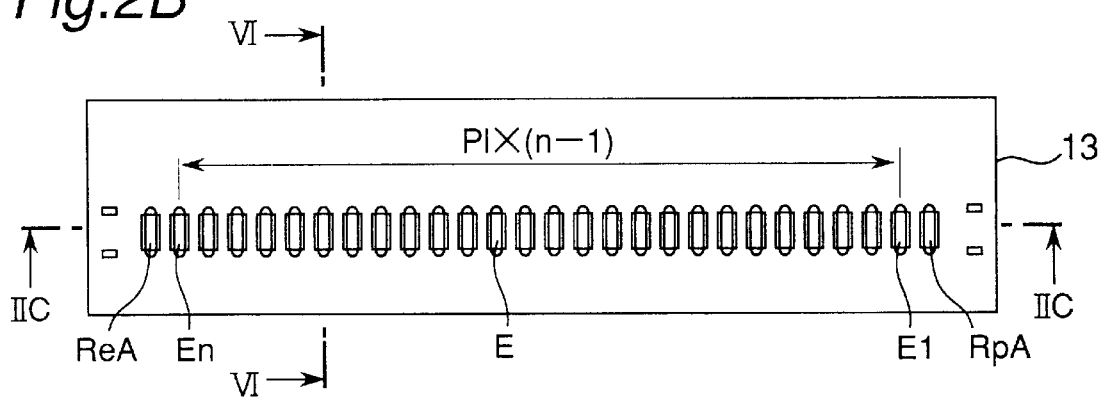
FIG. 2B is a plan view showing an alternative of the circuit board of FIG. 1B.
Figure 2C:
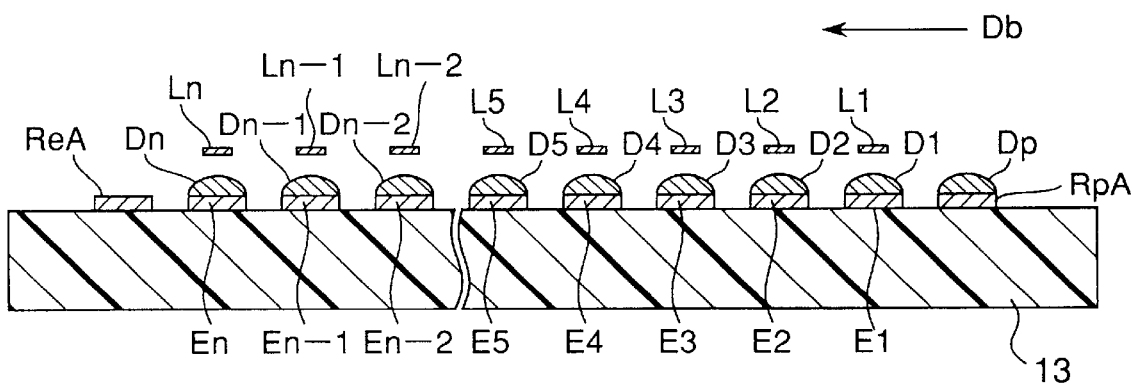
FIG. 2C is a cross-sectional view of the circuit board of FIG. 2B, taken along a line IIC to IIC, with the TCP of FIG. 2A located above.

FIGS. 2A, 2B, and 2C such the TCP and the circuit board 13 wherein an alternative pre-deposit solder receiver, RpA and excessive solder receiver ReA each having an area of one copper electrode E, are provided instead of the receivers Rp and Re, respectively.

In a case where no room is afforded for the excessive solder receiver Re, some of the copper electrodes E may be left without the solder printed thereon, whereby the like effect is achieved and confirmed in embodiments. That is, when the excessive solder receiver Re of twice the area is to be used, the final electrode En and the preceding copper electrode En-1, i.e., two electrodes in total, are left unprinted, so that the leads L are bonded properly while the solder in the solder pool 21 is removed.

If the excessive solder receiver ReA of the same area as the bonding copper electrode E is to be provided, only the final electrode En is left without the solder coated, whereby the copper electrodes E and leads L are well bonded simultaneously when the solder at the bottom wall 18 is removed.

The constitution of the circuit board and how to bond the circuit board will be described with reference to FIGS. 4 and 5. In the first place, a bonding solder D is formed on the copper electrodes E on the circuit board 13 as shown in FIG. 4. More specifically, a solder paste is printed on the copper electrodes E with the use of a metal mask, and melted by heating of the whole body. After the copper electrodes E are sufficiently wet with the solder, the whole body is cooled to solidify the solder to form the solder deposit D.

In the conventional manner, as is described earlier with reference to FIG. 7, the solder deposit D is formed on all the copper electrodes E corresponding to the leads L from the starting lead Li to the final lead Ln. As such, a sufficient solder pool 21 has not yet been formed at the bottom wall 18 of the soldering iron 16 at a time when the starting lead Li is bonded, with the result that the starting lead Li is not sufficiently wet with the solder.

According to the present invention, in contrast to the prior art, the pre-deposit solder receiver Rp with the solder Dp printed thereon is additionally provided at a position immediately before the starting lead L1 is bonded by the bottom wall 18 of the soldering iron 16, as best shown in FIG. 1C. The pre-deposit solder receiver Rp feeds the solder Dp printed thereon to the bottom wall 18 of the soldering iron 16 immediately before the starting electrode L1 starts to be bonded, thus contributing to stable formation of the solder pool 21. In a case where the stable solder pool 21 is present, it enables favorable bonding of the starting electrode E1 with the starting lead Li.

As described above, in order to prevent the generation of short-circuits between the adjacent leads L by the increased amount of solder which is accumulated in the solder pool 21, the excessive solder receiver Re with no solder printed thereon is provided. However, instead of the excessive solder receiver Re, it is also effective to gradually lessen the amount of the solder D formed on the copper electrodes E on the circuit board 13, as described below.

Figure 3:
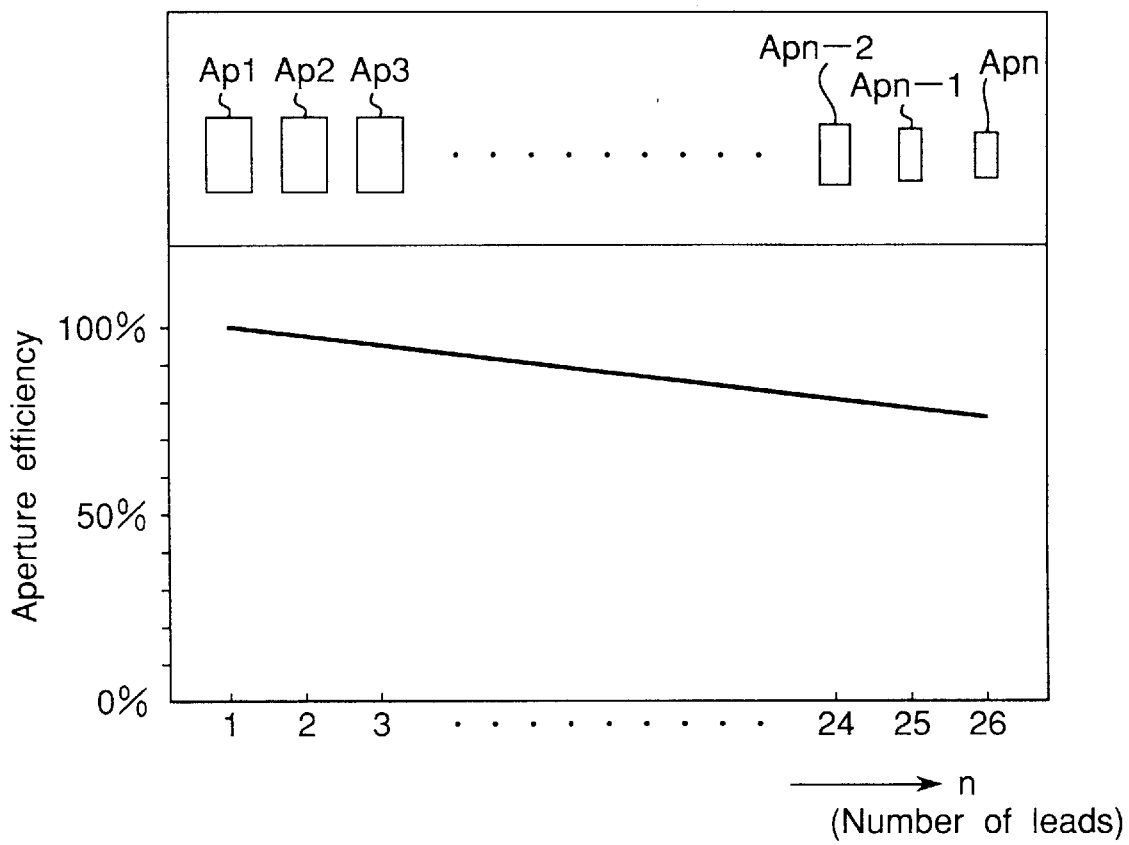
FIG. 3 is a graph showing a relationship between an aperture efficiency of a metal mask for printing of solder and the number of leads.

Referring to FIG. 3, a graph representing a change of an aperture efficiency (on an axis of ordinate) of a metal mask for printing a solder paste to electrodes on the circuit board (on an axis of abscissa) is shown. Also a conceptual diagram of the metal mask is shown in the upper part of this graph. When the aperture efficiency of the metal mask is gradually decreased proportionally to an increase of the electrodes (number of leads), an amount of the solder is gradually reduced subsequent to a heating/cooling process in the circuit board. This can be realized by reducing the size of apertures Ap1 to Apn formed in the mask gradually along the bonding direction Db at a predetermined rate.

In bonding the circuit board obtained as above by the bottom wall 18 of the soldering iron 16 shown in FIG. 5, short-circuits of the leads are not brought about even in the latter stage of bonding. Although the amount of the solder is reduced with a different rate depending on a bonding distance, the rate is desirably 50–80%. As apparent from FIG. 3, the rate in this embodiment is 70%, because the number "n" of leads L is set to twenty-six.

As discussed hereinabove, according to the present invention, the circuit board includes an electrode to which the solder is printed and an electrode without the solder printed and a group of electrodes where an amount of the solder is gradually decreased. In executing bonding for this circuit board with the use of a soldering iron, short-circuits by the solder, adhesion of the solder onto the circuit board or the like inferior bonding are prevented.

It is to be noted that any suitable bonding material other than solder such as, but not limited to a molten filler metal that wets the leads L and electrodes E, can be used for the bonding operation. Similarly, for the electrodes E and receivers Rp and Re, materials other than copper that can be wetted by such bonding material can be used.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A circuit board comprising:

a substrate;

a plurality of electrodes provided on said substrate and aligned on a line, said electrodes being of substantially the same shape and including a first end-most electrode at a first end of said plurality of electrodes and a second end-most electrode at a second end of said plurality of electrodes opposite said first end thereof; and a pre-deposition bonding material holder provided on said substrate and aligned on the line with said plurality of electrodes, said pre-deposition bonding material holder being disposed adjacent said first end-most electrode for storing a bonding material for use in ensuring availability of sufficient bonding material for bonding of said first end-most electrode to an electric part;

a quantity of bonding material disposed on each of said electrodes;

a quantity of bonding material disposed on said pre-deposition bonding material holder, said bonding material disposed on said pre-deposition bonding material holder being separated and discrete from said bonding material disposed on said first end-most electrode;

an excessive bonding material receiver provided on said substrate and aligned on the line with said plurality of electrodes, said excessive bonding material receiver being disposed adjacent said second end-most electrode for receiving excessive bonding material not used for bonding of said electrodes to the electric part;

wherein said quantities of bonding material respectively disposed on said electrodes are separated and discrete from one another; and wherein no bonding material is disposed on said excessive bonding material receiver.

2. A circuit board comprising:

a substrate;

a plurality of electrodes provided on said substrate and aligned on a line, said electrodes being of substantially the same shape and including a first end-most electrode at a first end of said plurality of electrodes and a second end-most electrode at a second end of said plurality of electrodes opposite said first end thereof; and separated and discrete quantities of bonding material respectively disposed on said electrodes, said quantities of bonding material being successively reduced in amount from said quantity of bonding material on said first endmost electrode to said quantity of bonding material disposed on said second end-most electrode, such that the quantity of bonding material disposed on said first end-most electrode is greatest among the quantities of bonding material disposed on said electrodes and the quantity of bonding material disposed on said second end-most electrode is least among the quantities of bonding material disposed on said electrodes.

3. A circuit board comprising:

a substrate;

a plurality of electrodes provided on said substrate and aligned on a line, said electrodes being of substantially the same shape and including a first end-most electrode at a first end of said plurality of electrodes and a second end-most electrode at a second end of said plurality of electrodes opposite said first end thereof;

separated and discrete quantities of bonding material respectively disposed on successive ones of said electrodes including said first end-most electrode; and wherein no bonding material is disposed on at least said second end-most electrode.

* * * * *